United States Patent [19]

Coon et al.

[11] Patent Number: 4,602,352

[45] Date of Patent: Jul. 22, 1986

[54] APPARATUS AND METHOD FOR DETECTION OF INFRARED RADIATION

[75] Inventors: Darryl D. Coon, Pittsburgh, Pa.; Gustav E. Derkits, Jr., New Providence, N.J.

[73] Assignee: University of Pittsburgh, Pittsburgh, Pa.

[21] Appl. No.: 601,230

[22] Filed: Apr. 17, 1984

[51] Int. Cl.[4] ............................................. G11C 11/42
[52] U.S. Cl. .................................... 365/114; 365/174; 357/32
[58] Field of Search ............... 365/106, 114, 174, 178; 357/29, 30, 31, 32

[56] References Cited

U.S. PATENT DOCUMENTS

| | | | |
|---|---|---|---|
| 2,677,714 | 5/1954 | Auwarter | 136/89 |
| 3,182,198 | 5/1965 | Mahlman | 365/103 |
| 3,341,825 | 9/1967 | Schrieffer | 365/103 |
| 3,398,316 | 8/1968 | Morton et al. | 315/10 |
| 3,652,270 | 3/1972 | Yamashita | 96/115 |
| 3,786,441 | 1/1974 | Engeler et al. | 365/114 |
| 3,801,820 | 4/1974 | Eichelberger et al. | 365/114 |
| 3,904,911 | 9/1975 | Welsch | 313/366 |
| 4,085,456 | 4/1978 | Tompsett | 365/114 |
| 4,107,564 | 8/1978 | Klimin et al. | 313/94 |
| 4,225,222 | 9/1980 | Kempter | 355/3 DR |
| 4,241,421 | 12/1980 | Burke et al. | 365/114 |
| 4,265,991 | 5/1981 | Hirai et al. | 430/64 |
| 4,349,617 | 9/1982 | Kawashiri et al. | 430/59 |
| 4,356,246 | 10/1982 | Tabei et al. | 430/136 |
| 4,359,512 | 11/1982 | Fukuda et al. | 430/57 |
| 4,359,514 | 11/1982 | Shimizu et al. | 430/65 |
| 4,394,426 | 7/1983 | Shimizu et al. | 430/65 |

OTHER PUBLICATIONS

C. R. McCrieght et al., "Infrared Charge-Injection-Device Array Performance at Low Background" Applied Optics, Sep. 15, 1981, vol. 20, No. 18.

Primary Examiner—Terrell W. Fears
Attorney, Agent, or Firm—Arnold B. Silverman

[57] ABSTRACT

An infrared detector and method of detection based on depletion of charge stored in localized states is disclosed. The detector and method involve the determination of the depletion of charge stored in localized states at low temperatures caused by electric field-assisted photoemission of charge carriers from the localized states. The depletion of stored charge is indicative of the integrated incident flux of infrared radiation. The depletion of stored charge can be sensed by quantum mechanical field ionization, field detachment or otherwise.

38 Claims, 5 Drawing Figures

APPARATUS AND METHOD FOR DETECTION OF INFRARED RADIATION

The present invention is partially sponsored by the Commonwealth of Pennsylvania, acting through the board of the Ben Franklin Partnership Fund and the MPC Corporation.

BACKGROUND OF THE INVENTION

1. Field Of The Invention

This invention relates to an apparatus and method for use in the detection of infrared radiation. More specifically, infrared radiation is detected by measuring depletion of charge stored in localized states in a semiconductor caused by electric field-assisted photoemission of charge carriers from the localized states.

2. Description Of The Prior Art

Various types of radiation detectors and detection methods employing charge storage are known in the art.

U.S. Pat. No. 3,341,825, for example, discloses a quantum mechanical information storage system in which storage and retrieval of information is accomplished by scanning a storage medium with a beam of radiant energy. A bit of information is written or stored on a particular location on the material by a beam of light of a particular frequency or wave length and is retrieved from the material with a beam of light of a different wave length. The memory material consists of a semiconductor material into which certain impurities are introduced to act as energy level traps for electrons. A light beam of a particular frequency impinging on the memory material at a particular position causes the energy level of electrons at that position to be raised from the valence level to a higher level called the storage level. The electrons remain at the storage level until they are raised to the conduction level by the action of a light beam of a frequency different from the first.

Additionally, U.S. Pat. No. 4,167,791 discloses a semiconductor memory device exhibiting nonvolatile information storage. The device comprises a storage element, maintained in a prescribed range of temperatures, which exhibits an effect of charge storage and release of the stored charge upon application of a suitable bias voltage. The device is exemplarily made of silicon in which the rectifying region consists of a region of highly doped p-type material and a region of highly doped n-type material and, in between the highly doped regions, a region of very lightly doped material. Information is stored by exposure to light or by applying a bias voltage to put the device into one of a multiplicity of long lived states. In the case of exposure to light the state of the device is indicative of the integrated photon flux. Shining light on the device at the initial bias, before applying a voltage sweep, results in a larger pulse being caused by said voltage sweep, although the pulse never exceeds a certain saturation size. Under appropriate conditions the size of the pulse is a monotonically increasing function of the total amount of light incident on the device.

The effect of the initial input of information by exposure to radiation in each of the prior art devices hereinbefore described is to cause an increase in the amount of charge stored in such devices. The effect of exposure to infrared radiation with the present invention, on the other hand, is to cause a depletion of stored charge.

A major problem with detection systems which measure electrical signal output during exposures to radiation is that it is extremely difficult to measure low intensity infrared radiation with such devices because the electrical signal output is exceedingly small. To overcome this problem, external integration of the output signal may be utilized to accumulate a larger, more detectable signal over a period of time. With presently known integrating detectors, however, deleterious noise and other problems are introduced by the external transfer of information.

A problem with detection systems based on an increase in stored charge such as is described in the above-mentioned patents is that such systems require relatively large photon energies to excite carriers which can be trapped in localized states associated with typical impurity levels to cause an increase in the stored charge. As a result for a particular localized state in a particular semiconductor, the wavelength range within which the amount of stored charge can be altered by radiation exposure is limited to relatively short wavelengths.

There remains, therefore, a need for a detector and method of detection which is capable of detecting low intensities of infrared radiation while avoiding the problems associated with external integration of the output current. There remains a further need for a detector and method which provides in situ integration of radiation with lower photon energy to allow for the detection of much longer wavelengths of radiation with any particular semiconductor.

SUMMARY OF THE INVENTION

The present invention provides a solution to the above-mentioned problems by providing a detector and detection method in which infrared radiation is detected by electrical measurement of the depletion of charge stored in localized states of a semiconductor caused by field-assisted photoemission of charge carriers from the localized states. The photon energy required to cause a depletion of stored charge by photoemission is significantly less than that required to excite carriers which can be trapped in localized states. As a result, the present invention may be advantageously utilized to detect longer wavelengths of radiation than systems which trap charge carriers excited by radiation.

In its simplest form, the detection method of the present invention involves the steps of: storing charge in localized states in a semiconductor; maintaining the temperature of the semiconductor sufficiently low to avoid any appreciable thermal excitation of charge carriers out of the localized states; applying a first electric field to the localized states; exposing the semiconductor to electromagnetic radiation having sufficient energy to cause photoemission of charge from the localized states; and determining the extent of depletion of charge caused by the photoemission. The apparatus used in connection with the above-described method includes a semiconductor having localized states therein and suitable means for accomplishing each of the hereinbefore-mentioned steps.

It is an object of the present invention to provide an infrared detector and detection method in which radiation is detected by measuring the depletion of charge stored in localized states of a semiconductor caused by field-assisted photoemission of charge carriers from the localized states.

It is another object of the present invention to provide such a detector and method requiring less photon energy than systems employing the same material which trap photoexcited carriers.

It is yet another object of the invention to provide such a detector and method which can be utilized to measure low intensity radiation of longer wavelength than systems which trap charge carriers excited by radiation.

It is yet another object of the invention to provide a detector and method having long term internal signal integration capabilities.

These and other objects of the invention will be more fully understood from the following description of a presently preferred embodiment of the invention on reference to the illustrations appended hereto.

DESCRIPTION OF THE PREFERRED EMBODIMENTS

Figure 1:
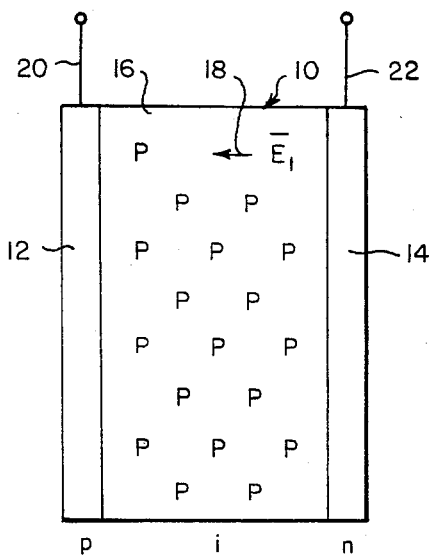
FIG. 1 illustrates schematically a semiconductor having a p-layer, an n-layer and an i-layer therebetween containing charge stored in localized states associated with phosphorus impurities.

This application is related to application Ser. No. 600,569, Apparatus and Method for Infrared Imaging, filed by sole inventor Darryl D. Coon on Apr. 17, 1984. That application differs from and is an improvement and extension of this application in that this application discloses a detector and method capable of measuring the *total* quantity of infrared radiation which strikes any single detector or element of an array. Application Ser. No. 600,569, on the other hand, provides an apparatus and method capable of detecting and storing a *pattern* of infrared radiation on a single semiconductor.

The present invention is described herein as an apparatus and method for detecting infrared radiation. The invention, however, is not limited solely to uses with infrared radiation and may be utilized in connection with various other electromagnetic wavelength ranges.

The present invention may be advantageously utilized to detect longer wavelengths of radiation than systems which trap charge carriers excited by radiation. In the case of localized states associated with phosphorus impurities in silicon, for example, wavelengths of about one micrometer or less would be required to photoexcite valence band electrons which could be trapped in phosphorus levels near the conduction band, thereby increasing the amount of charge stored in localized states. With the present invention, however, wavelengths as high as about 27 micrometers, for example, may be utilized to cause depletion of charge trapped in the phosphorous impurity levels in silicon. The long wavelengths associated with depletion of charge by means described herein are especially desirable for the detection of infrared radiation.

Additionally, the present invention may advantageously be used for detecting low intensity infrared radiation because of its unique capabilities of long term internal signal integration, as opposed to the external integration methods currently in use. The clear cut solid state physics associated with the detection method and apparatus of the present invention is useful in achieving high performance and the detector's internal integration capability reduces undesired noise and other problems associated with the external transfer of information.

The following refinements to the simplest form of the invention described in the Summary of the Invention apply equally to the method and to the apparatus of the invention.

The semiconductor of the present invention is preferably selected from the group consisting of silicon, germanium, gallium arsenide and semiconductor alloys such as $Ga_xAl_{1-x}As$, for example. The localized states in the semiconductor may comprise conduction band electrons, valence band holes or a combination of conduction band electrons and valence band holes. The electrons and/or holes are preferably bound to either charged or neutral impurities.

One of the means contemplated for storing of charge in localized states is injection of charge carriers from one or more electrical contacts which are electrically connected to the semiconductor whereby the charge carriers are captured and trapped in localized states. In this regard, the electrical contacts may comprise heavily doped n-type regions, heavily doped p-type regions, or heavily doped n-type and heavily doped p-type regions of the semiconductors.

More specifically, one means of storing charge in the i-region of a p-i-n diode, for example, consists of electrical injection of carriers by means of a temporary forward bias voltage applied to the p-i-n diode. Such a temporary forward bias voltage could be applied using an electronic waveform generator or electronic pulse generator electrically connected to the diode. Waveform generators or waveform generators supplemented by amplifiers have sufficient flexibility to apply, change or maintain potential differences between electrical contacts, and thereby to apply, change or maintain the electric fields required during photoemission and for the release of charge by field ionization.

The temperature of the semiconductor may be maintained sufficiently low by cooling it with liquid helium or by any other suitable means which are well known. It will be obvious to those skilled in the art that the temperature requirements for any particular application will depend on the length of integration time required. As the temperature increases, the percentage of the stored charge depleted by thermal excitation will increase relative to the percentage depleted by photoemission. In addition, undesirable fluctuations in the amount of depletion caused by thermal excitation will increase with increasing temperatures. A suitable temperature for a silicon semiconductor having phosphorus impurities, for example, could be in the range of about 0 degrees to 16 degrees Kelvin.

The first electric field applied to the localized states may be maintained by providing a potential difference between electrical contacts provided on the semiconductor or by any other suitable means. Such a potential difference could be provided, for example, by a voltage waveform generator. Preferably the field has a moderate strength as compared to the lower electric fields applied to many known detectors such as photoconductors. For a silicon semiconductor having phosphorus impurities, a field strength of 0.4 volts per micrometer, for example, would provide a suitable result. The first electric field, however, should have a strength which is sufficiently low (less than about 0.8 volts per micrometer for phosphorus impurities in silicon) to avoid appreciable depletion of charge stored in localized states in the absence of infrared radiation. The photon energy required to cause photoemission from a localized state is normally greater than the binding energy or zero-field ionization energy of the localized state. For example, 0.045 electron volts is the binding energy for phosphorus impurities in silicon. However, the required photon energy can be lowered by the applied field. Therefore, the range of photon energies detectable according to the present invention may advantageously be varied by altering the strength of the first electric field.

One means of exposing the semiconductor to infrared radiation consists of admitting infrared radiation into the semiconductor through the p-layer or n-layer by making at least one such layer sufficiently thin (for example, about one micron or less) to efficiently transmit infrared radiation. The radiation could be thermal radiation from any warm body or any scene. One example of an application in which low intensity radiation might be integrated for long periods of time involves the detection of infrared radiation from space.

Various methods and means for determining the extent of depletion of charge caused by the photoemission are contemplated. One such method involves the application of a second electrical field (for example, 1.3 volts per micrometer for phosphorus impurities in silicon) having a strength greater than the first field and sufficient to cause the release of charge remaining in the localized states after exposure to the infrared radiation. The amount of charge released by the second field can be measured and subtracted from the total charge to determine the depletion of charge caused by photoemission. Generally speaking, charge may be measured by using an electronic, charge mode, analog-to-digital converter interfaced to a computer, for example. The means of determining the extent of depletion of charge caused by photoemission described herein involves determination of the net depletion of charge in the detector and hence the net flux which is incident on the detector. In order to store the image of a scene or, more generally, a pattern of infrared radiation, an array of such detectors may be employed. The release of charge caused by the application of the second field is known as ground state field ionization.

Another method for determining the extent of depletion caused by photoemission involves the measurement of the electric field associated with the space charge due to ionization of localized states. Yet another method involves the measurement of the charge required to repopulate the localized states from which charge has been released during the photoemission.

In addition to providing an individual detector and method of infrared detection, the present invention also includes an infrared detection system wherein a plurality of detectors as described above are provided as an array on a single semiconductor wafer, for example. It will be obvious to those skilled in the art that by providing a larger number of detectors in the array, a higher resolution may be obtained.

Referring specifically to FIG. 1, a semiconductor 10 is provided. In the form shown, the semiconductor is formed of silicon and has a p-layer 12 heavily doped with boron, for example, an n-layer 14 heavily doped with phosphorus and an i-layer 16 therebetween containing charge stored in localized states associated with phosphorus impurities P. P represents phosphorus atoms including electrons in each atom's ground state energy level. An electric field $\overline{E}_1$ is provided in the direction of arrow 18 by means of electrical leads 20 and 22.

Figure 2:
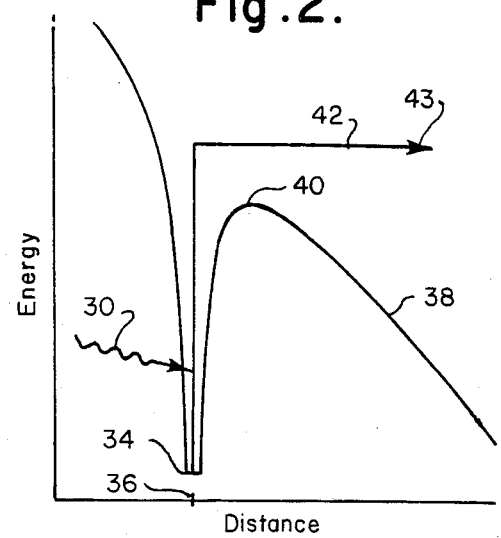
FIG. 2 is a plot of an electron potential energy barrier and the infrared induced photoemission of an electron from a phosphorus impurity atom in the presence of an applied electrical field.

Referring now to FIG. 2, a plot of an infrared induced photoemission of an electron from a phosphorus impurity atom in the presence of an applied electric field is shown. In both FIGS. 2 and 4, energy is shown on the ordinate or y-axis and distance is shown on the abscissa or x-axis. An infrared photon 30 is shown interacting with the phosphorus atom. The phosphorus atom's electron ground state energy level is shown at 34 and the center of the atom is indicated at 36. The atom's electron potential energy barrier is indicated as 38 and the height 40 of energy barrier 38 controls the range of photon energy which is detectable. In FIG. 2, photon 30 is shown to have sufficient energy to cause an electron of the phosphorus atom to be photoemitted. The photoemitted electron is shown at 42 and is caused to move in the direction of arrow 43 by the applied field $\overline{E}_1$ shown in FIG. 1.

Figure 3:
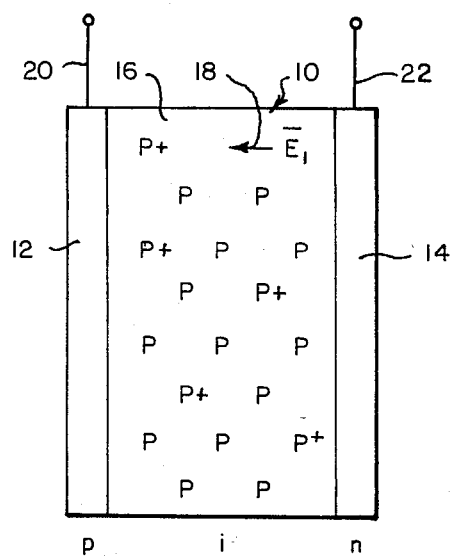
FIG. 3 illustrates schematically the semiconductor of FIG. 1 after exposure to infrared radiation showing a partial depletion of charge in the localized states.

FIG. 3 illustrates the semiconductor of FIG. 1 after exposure to infrared radiation. Phosphorus atoms P which have lost their most weakly bound electrons become positively charged phosphorus ions P+ as shown. FIG. 3 shows the partial depletion of charge in the localized states caused by infrared photoemission.

Figure 4:
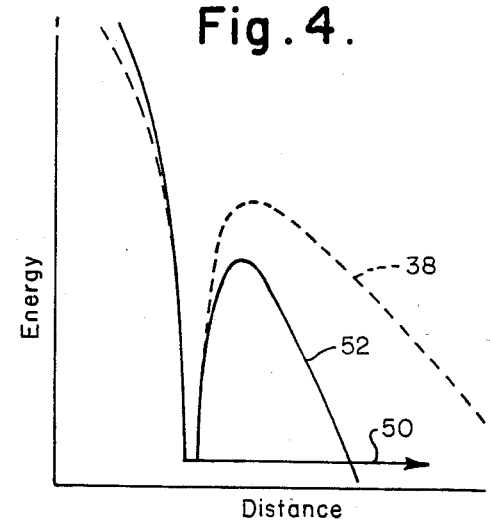
FIG. 4 is a plot of a reduced electron potential energy barrier caused by the application of a stronger electric field than that of FIG. 2 and the emission of electrons by ground state field ionization.

FIG. 4, which corresponds generally to the illustration shown in FIG. 2, illustrates the emission of electrons 50 by ground state field ionization. FIG. 4 shows that the application of a stronger field $\overline{E}_2$ (see FIG. 5) causes a reduced electron potential energy barrier 52 as compared to barrier 38 of FIG. 2 and allows the electrons 50 to escape from their respective atoms under the force of field $\overline{E}_2$ by tunneling through barrier 52. Barrier 52 is generated by a combination of the potential associated with $\overline{E}_2$ and the Coulomb potential which binds the electron in the phosphorus atom. Barrier 52 is lower and less thick than barrier 38 (FIG. 2) thereby allowing for easier escape of electrons.

Figure 5:
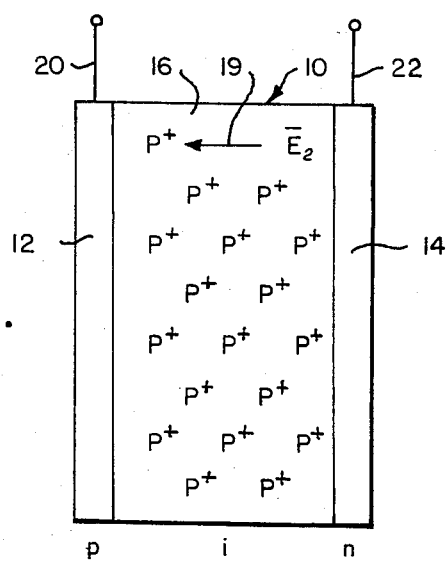
FIG. 5 illustrates schematically the semiconductor of FIG. 1 after the application of a strong electric field and shows the total depletion of charge from localized states.

FIG. 5 illustrates the semiconductor of FIG. 1 after the application of a strong electric field $\overline{E}_2$ in the direction of arrow 19. Note that i-region 16 now contains only phosphorus ions P+ and that the charge is now totally depleted from the localized states.

It will be appreciated, therefore, that the present invention provides an infrared detector and detection method in which radiation is detected by measuring or calculating the depletion of charge stored in localized states of a semiconductor caused by field-assisted photoemission of charge carriers from the localized states. It further provides a detector and method capable of measuring low intensity, long wavelength radiation and capable of internal signal integration.

While we have shown and described certain present preferred embodiments of the invention and have illustrated a presently preferred method of practicing the same it is to be distinctly understood that the invention is not limited thereto but may be otherwise embodied within the scope of the following claims.

We claim:

1. A method of detection of electromagnetic radiation comprising:
   (a) storing of charge in localized states in a semiconductor;
   (b) maintaining the temperature of said semiconductor sufficiently low to avoid appreciable thermal excitation of charge carriers out of said localized states;
   (c) applying a first electric field to said localized states;
   (d) exposing the semiconductor to electromagnetic radiation having sufficient energy to cause photoemission of charge from said localized states; and
   (e) determining the extent of depletion of charge caused by said photoemission.

2. A method according to claim 1 including storing of charge in localized states which comprise conduction band electrons bound to charged impurities.

3. A method according to claim 1 including storing of charge in localized states which comprise conduction band electrons bound to neutral impurities.

4. A method according to claim 1 including storing of charge in localized states which comprise valence band holes bound to charged impurities.

5. A method according to claim 1 including storing of charge in localized states which comprise valence band holes bound to neutral impurities.

6. A method according to claim 1 including storing of charge in localized states which comprise conduction band electrons and valence band holes bound to charged impurities.

7. A method according to claim 1 including storing of charge in localized states which comprise conduction band electrons and valence band holes bound to neutral impurities.

8. A method according to claim 1 including storing of charge in localized states of a semiconductor which is selected from the group consisting of silicon, germanium, gallium arsenide and semiconductor alloys.

9. A method according to claim 1 wherein determining the depletion of charge stored in localized states is accomplished by applying a second electric field to said localized states having a strength greater than said first field and sufficient to cause the release of charge remaining in the localized states after exposure to said radiation and by measuring the released charge.

10. A method according to claim 9 wherein the releasing of charge comprises field ionization.

11. A method according to claim 1 wherein determining the depletion charge stored in localized states is accomplished by measuring the electric field associated with the space charge due to ionization of localized states.

12. A method according to claim 1 wherein determining the depletion of charge stored in localized states is accomplished by measuring the charge required to repopulate the localized states from which charge has been released during said photoemission.

13. A method according to claim 1 wherein storing of charge in localized states is accomplished by injecting charge carriers from at least one electrical contact into said semiconductor whereby said charge carriers are captured and trapped in localized states.

14. A method according to claim 13 wherein storing of charge in localized states is accomplished by injecting charge carriers from an electrical contact comprised of a heavily doped n-type region of said semiconductor.

15. A method according to claim 13 wherein storing the charge in localized states is accomplished by injecting charge carriers from an electrical contact comprised of a heavily doped p-type region of said semiconductor.

16. A method according to claim 13 wherein storing of charge in localized states is accomplished by injecting charge carriers from electrical contacts comprised of a heavily doped n-type region and a heavily doped p-type region of said semiconductor.

17. A method according to claim 1 wherein applying said first electric field is accomplished by providing a potential difference between electrical contacts provided on said semiconductor.

18. A method according to claim 1 further comprising altering the strength of said first electric field to vary the range of photon energies which are detected.

19. A detector of electromagnetic radiation comprising:
   (a) a semiconductor having localized states therein;
   (b) means for storage of charge in said localized states in the semiconductor;
   (c) means for maintaining the temperature of said semiconductor sufficiently low to avoid appreciable thermal excitation of charge carriers out of said localized states;
   (d) means for applying a first electric field to said localized states;
   (e) means for exposing the semiconductor to electromagnetic radiation having sufficient energy to cause photoemission of charge from said localized states; and
   (f) means for determining the extent of depletion of charge caused by said photoemission.

20. A detector according to claim 19 wherein said localized states comprise conduction band electrons bound to charged impurities.

21. A detector according to claim 19 wherein said localized states comprise conduction band electrons bound to neutral impurities.

22. A detector according to claim 19 wherein said localized states comprise valence band holes bound to charged impurities.

23. A detector according to claim 19 wherein said localized states comprise valence band holes bound to neutral impurities.

24. A detector according to claim 19 wherein said localized states comprise conduction band electrons and valence band holes bound to charged impurities.

25. A detector according to claim 19 wherein said localized states comprise conduction band electrons and valence band holes bound to neutral impurities.

26. A detector according to claim 19 wherein said semicondutor is selected from the group consisting of silicon, germanium, gallium arsenide and semiconductor alloys.

27. A detector according to claim 19 wherein said means for determining the depletion of charge stored in localized states further comprises:
   (a) means for applying an electric field to the localized states having sufficient strength to cause the release of charge from the localized states after exposure to said radiation; and
   (b) means for measuring the released charge.

28. A detector according to claim 27 wherein said means for applying an electric field includes field ionization means.

29. A detector according to claim 19 wherein said means for determining the depletion of charge stored in localized states further comprises means for measuring the electric field associated with the space charge due to ionization of localized states.

30. A detector according to claim 19 wherein said means for determining the depletion of charge stored in localized states further comprises measurement of charge required to repopulate the localized states from which charge has been released during field-assisted photoemission.

31. A detector according to claim 19 wherein said means for storage of charge in localized states further comprises injection of charge carriers from at least one electrical contact into said semiconductor whereby said charge carriers are captured and trapped in localized states.

32. A detector according to claim 31 wherein said electrical contact is comprised of a heavily doped n-type region of said semiconductor.

33. A detector according to claim 31 wherein said electrical contact is comprised of a heavily doped p-type region of said semiconductor.

34. A detector according to claim 31 wherein said electrical contacts are comprised of a heavily doped n-type region and a heavily doped p-type region of said semiconductor.

35. A detector according to claim 19 wherein said means for applying an electric field further comprises means for maintaining a potential difference between electric contacts provided on said semiconductor.

36. A detector according to claim 19 including means for changing the range of detectable photon energies by altering the strength of said first electric field.

37. A detector according to claim 19 wherein said localized states are impurities in the i-region of a p-i-n diode.

38. An infrared detection system wherein a plurality of detectors as described in claim 19 are provided as an array on a semiconductor wafer.

* * * * *